United States Patent [19]
Wada

[11] Patent Number: 5,568,432
[45] Date of Patent: Oct. 22, 1996

[54] SEMICONDUCTOR MEMORY DEVICE INCLUDING REDUNDANCY MEMORY CELL REMEDYING DEFECTIVE MEMORY CELL

[75] Inventor: Tomohisa Wada, Hyogo, Japan

[73] Assignee: Mitsubishi Denki Kabushiki Kaisha, Tokyo, Japan

[21] Appl. No.: 348,098

[22] Filed: Nov. 25, 1994

[30] Foreign Application Priority Data

Dec. 24, 1993 [JP] Japan .................................. 5-327706

[51] Int. Cl.⁶ .............................. G11C 7/00; G11C 29/00
[52] U.S. Cl. ................. 365/200; 365/189.02; 365/225.7; 365/189.05
[58] Field of Search ................................. 365/200, 189.05, 365/201, 230.03, 189.02, 189.01, 230.02, 225.7

[56] References Cited

U.S. PATENT DOCUMENTS

| | | | |
|---|---|---|---|
| 4,908,798 | 3/1990 | Urai .................................... | 365/230.03 |
| 5,134,585 | 7/1992 | Murakami et al. .................... | 365/200 |
| 5,297,085 | 3/1994 | Choi et al. ............................ | 365/200 |
| 5,343,439 | 8/1994 | Hoshino .............................. | 365/200 |
| 5,416,740 | 5/1995 | Fujita et al. .......................... | 365/200 |

FOREIGN PATENT DOCUMENTS 3-8200   1/1991   Japan .

OTHER PUBLICATIONS

"New Bit Line Architecture for Ultra High Speed SRAMS", Toru Shiomi et al., IEEE 1991 Custom Integrated Circuits Conference.

"A 5.8–NS 256–KB BICMOS TTL SRAM With T–Shaped Bit Line Architecture", Shiomi et al., IEEE Journal of Solid–State Circuits, vol. 28, No. 12, Dec. 1993, pp. 1362–1369.

*Primary Examiner*—Tan T. Nguyen
*Attorney, Agent, or Firm*—Lowe, Price, Leblanc & Becker

[57] ABSTRACT

A sense amplifier portion provides a predetermined number of data among a plurality of data provided from a bit line pair to a multiplexer. A sense amplifier amplifies data provided from a redundancy bit line pair for output to the multiplexer. The multiplexer is controlled by a redundancy control burst counter. When a defect occurs in a memory cell array, the multiplexer provides data provided from the sense amplifier instead of data provided from the sense amplifier portion. When there is no defect, the multiplexer provides predetermined data using data provided from the sense amplifier portion.

17 Claims, 13 Drawing Sheets

SEMICONDUCTOR MEMORY DEVICE INCLUDING REDUNDANCY MEMORY CELL REMEDYING DEFECTIVE MEMORY CELL

BACKGROUND OF THE INVENTION

1. Field of the Invention

The present invention generally relates to semiconductor memory devices, and more particularly, to a semiconductor memory device including a redundancy memory cell remedying a defective memory cell when a defect occurs in an ordinary memory cell array.

2. Description of the Background Art

In a semiconductor memory device in general, in terms of production yield, a redundancy memory cell is provided in a memory cell array in order to remedy a defective bit, and a memory cell in which a defect occurs is replaced with the redundancy memory cell.

Description will now be given of a conventional semiconductor memory device with reference to the drawings. FIG. 12 is a block diagram showing a configuration of the conventional semiconductor memory device.

In FIG. 12, the semiconductor memory device includes a row decoder 101, a memory cell array 102, a shift redundancy circuit 103, a shift redundancy control circuit 104, a sense amplifier portion 105, a multiplexer 106, and a burst counter 107. Memory cell array 102 includes bit lines BL, /BL ("/" indicates a complementary signal line or an inverted signal hereinafter), word lines WL, memory cells MC, redundancy bit lines BR, /BR, and redundancy memory cells MR.

An ordinary memory cell array is configured of a plurality of memory cells MC each holding one-bit information. Redundancy memory cell MR has the same configuration as that of memory cell MC, and holds one-bit information. A plurality of redundancy memory cells MR arranged in the column direction configure a redundancy memory cell array. The redundancy memory cell replaces a defective portion when a defect occurs in an ordinary memory cell array configured of memory cells MC.

Memory cells MC are connected to bit lines BL, /BL in the column direction. Similarly, redundancy memory cells MR are connected to redundancy bit lines BR, /BR in the column direction. Memory cells MC and redundancy memory cells MR are connected to word lines WL.

An address signal X is applied to row decoder 101. Row decoder 101 decodes the applied address signal X, and brings a predetermined word line WL to a selected state.

Shift redundancy circuit 103 is a switching circuit disconnecting, when a defect occurs in ordinary memory cell MC, a column including the defect from sense amplifier portion 105 and connecting an adjacent column thereto. The operation of shift redundancy circuit 103 is controlled by shift redundancy control circuit 104.

Data provided from shift redundancy circuit 103 is applied to sense amplifier portion 105. The data is provided to multiplexer 106 after being amplified to a predetermined amplitude.

Multiplexer 106 selects a plurality of data provided from sense amplifier portion 105 in response to multiplexer control signals provided from burst counter 107, and provides one of the data. A predetermined clock signal CLK is applied to burst counter 107. Burst counter 107 provides multiplexer control signals in synchronism with clock signal CLK. A binary counter, for example, is used as the burst counter.

According to the above operation, when a defect occurs in memory cell MC, data in the defective memory cell is replaced with data of redundancy memory cell MR, and data read out from the memory cell array simultaneously can be provided sequentially in synchronism with clock signal CLK.

The configuration of the shift redundancy circuit and sense amplifier portion shown in FIG. 12 will now be described with reference to FIG. 13.

In FIG. 13, the shift redundancy circuit and sense amplifier portion includes a bit line precharge circuit 111, a shift redundancy circuit 112, a writing circuit 113, and a sense amplifier 114.

Bit line precharge circuit 111 includes NMOS transistors Q201, Q202, and a PMOS transistor Q203. Bit line precharge circuit 111 precharges bit lines BL, /BL to a predetermined voltage level.

Shift redundancy circuit 112 includes resistances R201, R202, NMOS transistors Q211 to Q214, PMOS transistors Q216 to Q219, and fuse elements F201, F202. Shift redundancy circuit 112 switches connection between bit lines BLi /BLi and signal lines BA, /BA connected to sense amplifier 114 by disconnecting fuse elements F201, F202. More specifically, shift redundancy circuit 112 replaces a memory cell including a defect with a redundancy memory cell to remedy a defective bit by switching connection between bit lines BL, /BL and signal lines BA, /BA from sense amplifier 114.

Writing circuit 113 includes NMOS transistors Q221 to Q224, and NOR gates G201 to G204. Writing circuit 113 transmits an externally applied data signal to memory cell MC through shift redundancy circuit 112 and bit lines BL, /BL, and writes predetermined data in a predetermined memory cell.

Sense amplifier 114 includes transistors Q231 to Q238, PMOS transistors Q241, Q242, NMOS transistors Q243 to Q248, resistances R203, R204, and an inverter G211. Sense amplifier 114 amplifies a data signal applied through shift redundancy circuit 112 to a predetermined amplitude for output.

In the above conventional semiconductor memory device, since a memory cell including a defect is replaced with a redundancy memory cell by shift redundancy circuit 112, a shift redundancy circuit which is a switching circuit is connected in series in a path from input of an address signal X to output of output data Dout, thereby increasing an access time.

SUMMARY OF THE INVENTION

One object of the present invention is to provide a semiconductor memory device which can shorten an access time, and which can implement a high speed operation.

A semiconductor memory device according to one aspect of the present invention includes a memory cell array including a plurality of memory cells arranged in a matrix manner, a redundancy memory cell array including redundancy memory cells used when a defect occurs in a memory cell, a first reading circuit reading out data from the memory cell array, a second reading circuit reading out data from the redundancy memory cell array, and a selecting circuit receiving data provided from the first and second reading circuits, replacing data provided from the first reading circuit with data provided from the second reading circuit when a defect occurs in a memory cell, and selecting predetermined data between the data for sequential output.

Because of the above configuration, in the semiconductor memory device, predetermined data can directly be selected among data from the memory cell array and data from the redundancy memory cell array by the selecting circuit for sequential output. Therefore, data of a memory cell including a defect can be replaced with data of a redundancy memory cell. In addition, since a switching circuit such as a shift redundancy circuit is not connected in series in a data transmission path, an access time can be shortened. As a result, a high speed operation of the device can be implemented.

According to another aspect of the present invention, a semiconductor memory device includes a memory cell array including a plurality of memory cells arranged in a matrix manner, a redundancy memory cell array including redundancy memory cells used when a defect occurs in a memory cell, a first reading circuit reading out data from the memory cell array, a second reading circuit reading out data from the redundancy memory cell array, a defect information signal output circuit providing a defect information signal indicating whether data from the first reading circuit corresponds to a defective portion in the memory cell array, and a selecting circuit receiving data provided from the first and second reading circuits, replacing data provided from the first reading circuit with data provided from the second reading circuit in response to the defect information signal when a defect occurs in a memory cell, and selecting predetermined data among the data for sequential output.

In the semiconductor memory device of the above configuration, predetermined data can directly be selected among data from the memory cell array and data from the redundancy memory cell array by the selecting circuit in response to the defect information signal for sequential output. Therefore, data of the memory cell including a defect can be replaced with data of the redundancy memory cell. In addition, since a switching circuit such as a shift redundancy circuit is not connected in series in a data transmission path, an access time can be shortened. As a result, a high responsiveness of the device can be implemented. Since the defect information signal is used, the number of control signals can be reduced, making it possible to reduce an area occupied by an interconnection region and a circuit region, as well as a chip size.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
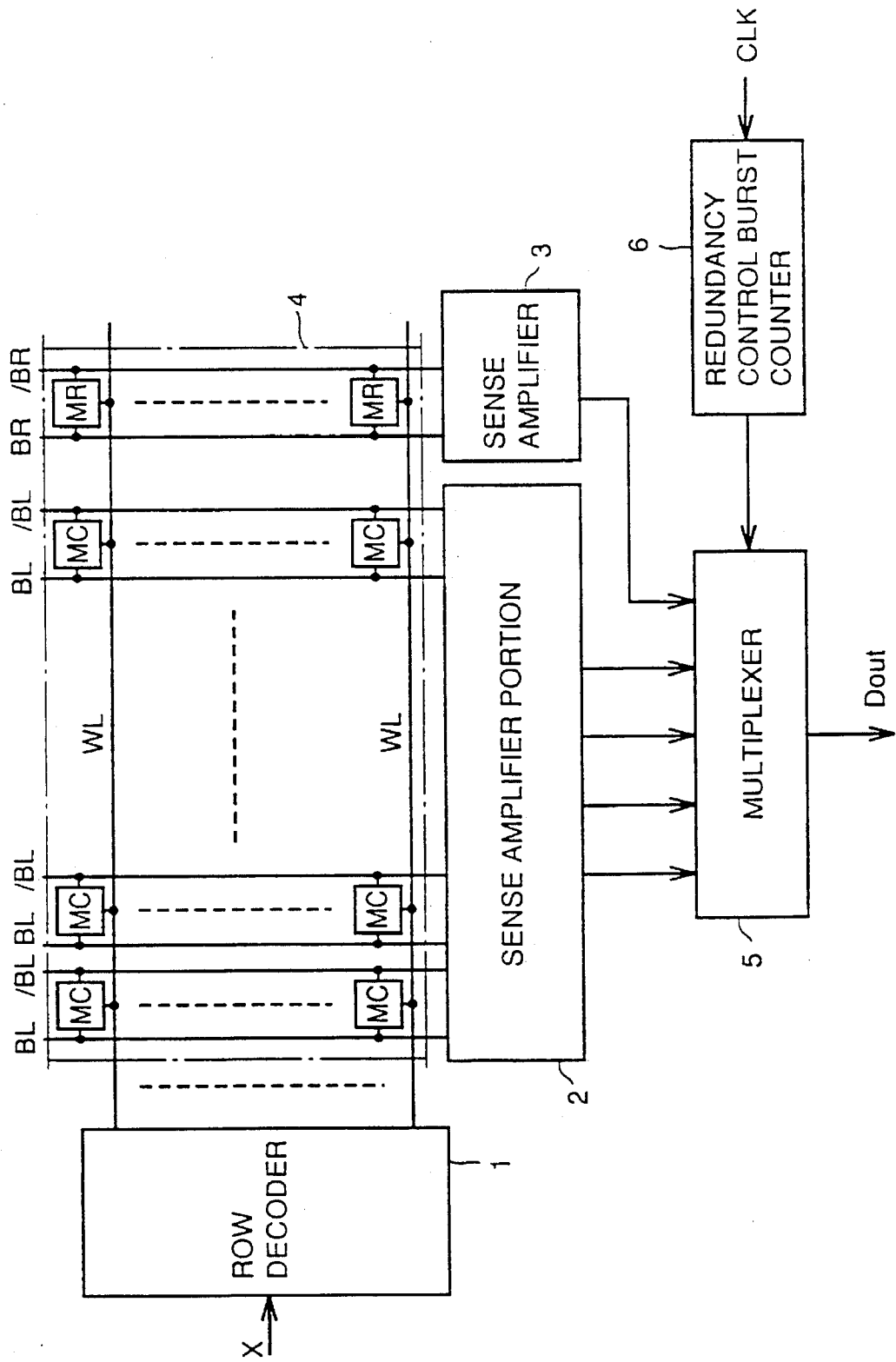
FIG. 1 is a block diagram showing a configuration of a semiconductor memory device according to a first embodiment of the present invention.

Description will now be given of a semiconductor memory device according to the first embodiment of the present invention with reference to the drawings. FIG. 1 is a block diagram showing a configuration of the semiconductor memory device according to the first embodiment of the present invention.

In FIG. 1, the semiconductor memory device includes a row decoder 1, a sense amplifier portion 2, a sense amplifier 3, a memory cell array 4, a multiplexer 5, and a redundancy control burst counter 6.

Memory cell array 4 includes bit lines BL, /BL, word lines WL, memory cells MC, redundancy bit lines BR, /BR, and redundancy memory cells MR.

Memory cell MC holds one-bit information. Memory cells MC arranged in a matrix manner configure an ordinary memory cell array. Redundancy memory cell MR also holds one-bit information. Redundancy memory cells MR arranged in the column direction configure a redundancy memory cell array. When a defect occurs in memory cell MC, the memory cell MC is replaced with redundancy memory cell MR.

Bit lines BL, /BL are connected to a plurality of memory cells MC in the column direction. Similarly, redundancy bit lines BR, /BR are connected to a plurality of redundancy memory cells MR in the column direction. Word line WL is connected to a plurality of memory cells MC and redundancy memory cell MR in the row direction.

Address signal X is applied to row decoder 1. Row decoder 1 decodes address signal X, and brings a predetermined word line WL to a selected state.

Sense amplifier portion 2 amplifies and provides to multiplexer 5 a plurality of data signals applied through predetermined bit lines BL, /BL in response to a control signal provided from a column decoder (not shown).

Sense amplifier 3 amplifies and provides to multiplexer 5 a data signal of a redundancy memory cell applied through redundancy bit lines BR, /BR. Therefore, data from an ordinary memory cell and data from a redundancy memory cell are applied to multiplexer 5 through sense amplifier portion 2 and sense amplifier 3, respectively.

Multiplexer 5 provides predetermined data among data applied in response to multiplexer control signals provided from redundancy control burst counter 6. More specifically, when a defect occurs in an ordinary memory cell array, and data of the defective memory cell is read out, data from a redundancy memory cell instead of data from the defective memory cell is provided as an output of multiplexer 5.

Redundancy control burst counter 6 provides multiplexer control signals, to be described later, in response to a predetermined clock signal CLK.

Because of the above operation, data of a defective memory cell in an ordinary memory cell array can be replaced with data of a redundancy memory cell, resulting in remedy of the defective memory cell.

Figure 2:
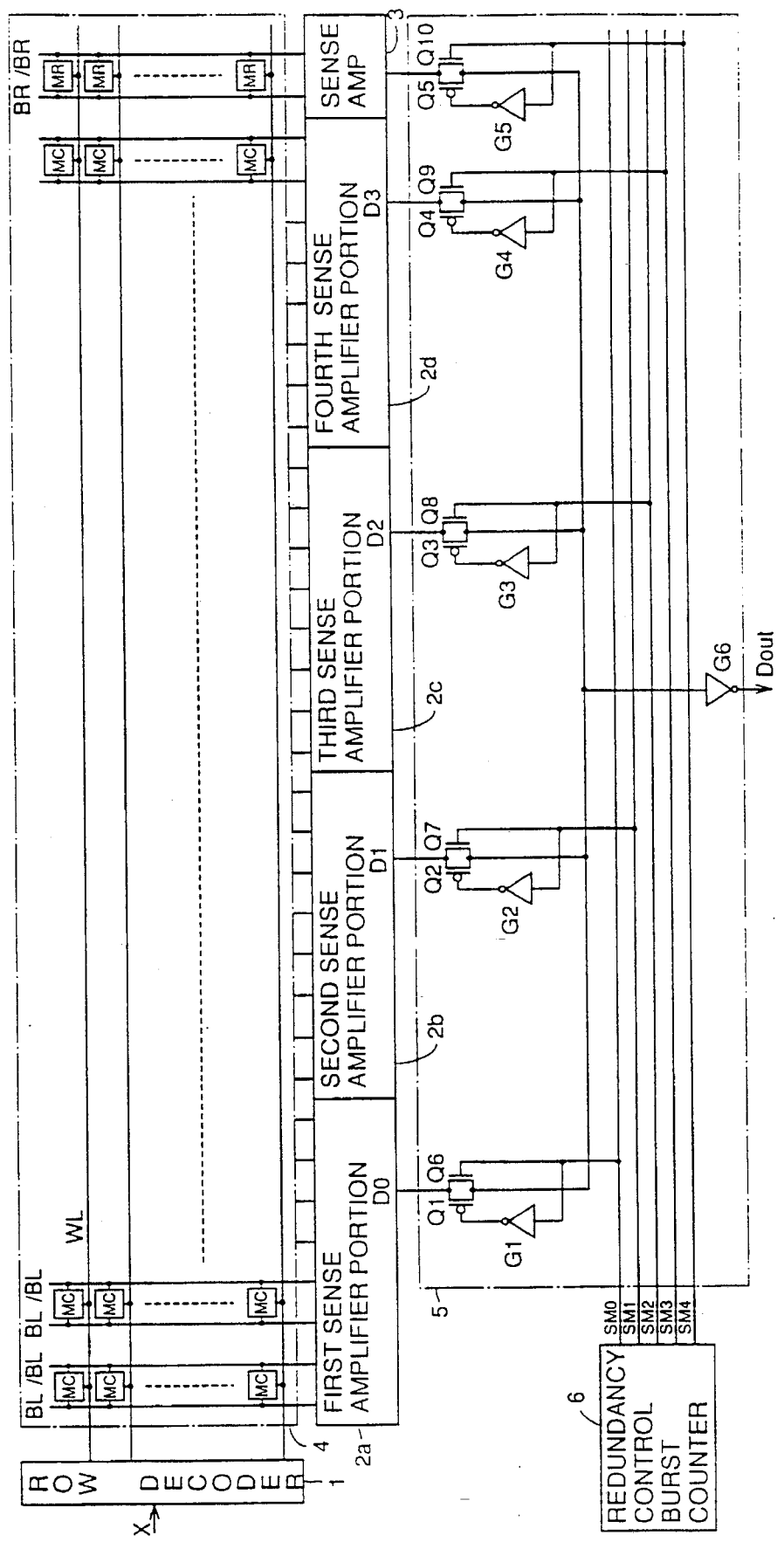
FIG. 2 is a diagram showing a detailed configuration of the semiconductor memory device shown in FIG. 1.

The above operation for remedying a defect will now be described in more detail. FIG. 2 is a diagram showing a more detailed configuration of the semiconductor memory device shown in FIG. 1.

As an example, sense amplifier portion 2 shown in FIG. 1 is divided into first to fourth sense amplifier portions 2a to 2d in FIG. 2. Respective sense amplifier portions 2a to 2d have the same configuration. Each sense amplifier portion has four pairs of bit lines BL, /BL connected thereto, and provides one of data D0 to D3.

Figure 3:
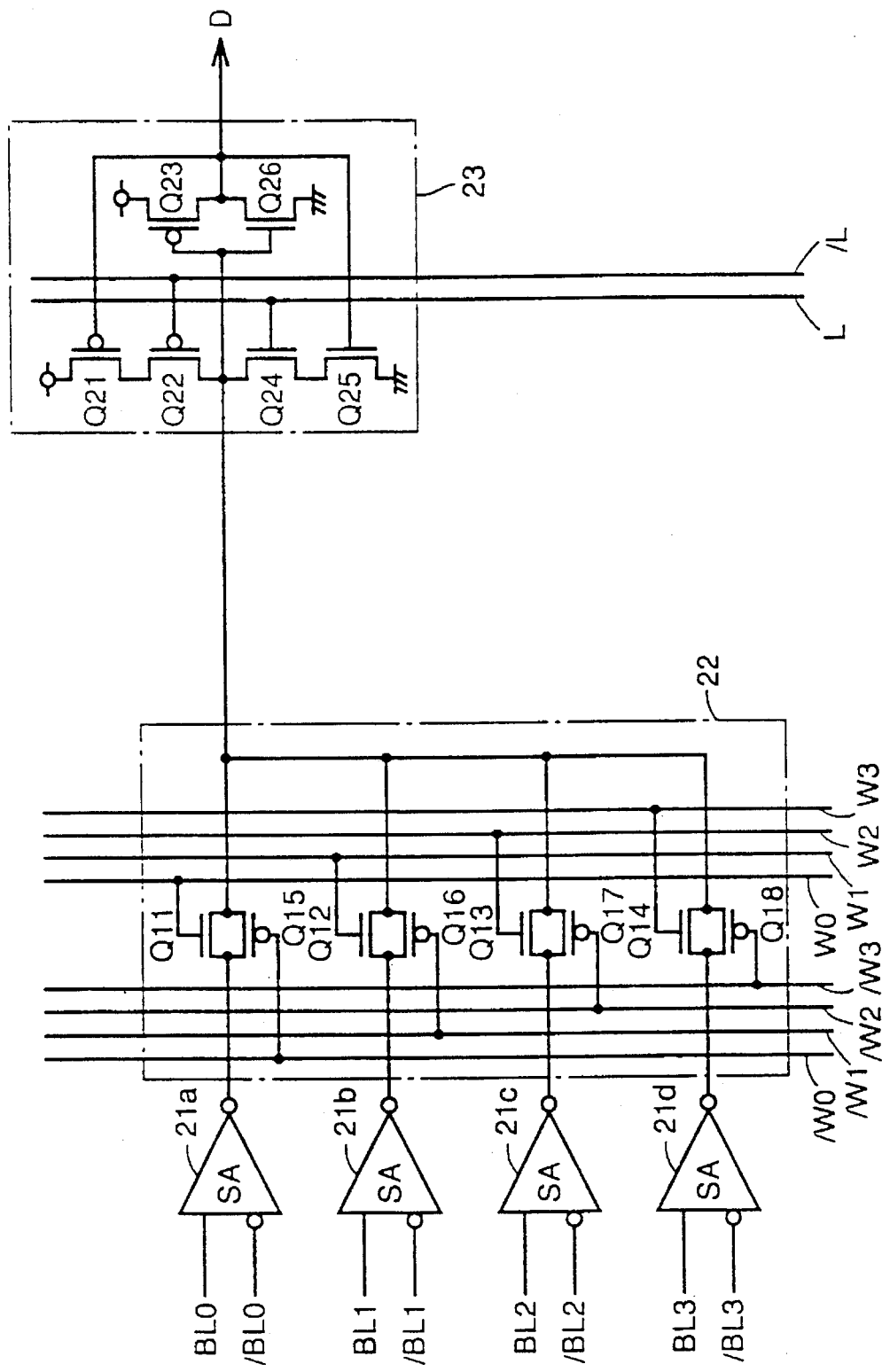
FIG. 3 is a circuit diagram showing a configuration of a first sense amplifier portion shown in FIG. 2.

The first to fourth sense amplifier portions shown in FIG. 2 will now be described in more detail. FIG. 3 is a circuit diagram showing a configuration of the first sense amplifier portion shown in FIG. 2.

In FIG. 3, the first sense amplifier portion includes sense amplifiers 21a to 21d, a multiplexer 22, and a data latch 23.

Sense amplifiers 21a to 21d are provided for bit line pairs BL0, /BL0, ..., BL3, /BL3, respectively. Sense amplifiers 21a to 21d each amplify and provide to multiplexer 22 an applied data signal.

Multiplexer 22 includes NMOS transistors Q11 to Q14 and PMOS transistors Q15 to Q18. Select signals W0 to W3 and their inverted signals /W0 to /W3 are applied to multiplexer 22. In response to each select signal, multiplexer 22 selects one output signal among output signals of four sense amplifiers 21a to 21d, and provides the selected output signal to data latch 23. When select signal W0 is at an "H" level, select signals W1 to W3 are at an "L" level, select signal /W0 is at the "L" level, and select signals /W1 to /W3 are at the "H" level, for example, an output signal of sense amplifier 21a is selected and provided to data latch 23.

Data latch 23 includes PMOS transistors Q21 to Q23 and NMOS transistors Q24 to Q26. Data latch 23 is a latch circuit. Data latch 23 holds and provides output data of multiplexer 22. Data latch 23 is controlled by latch control signals L, /L. When latch control signal L is at the "H" level and latch control signal /L is at the "L" level, data latch 23 is brought to a latched state. With latch control signals L, /L at the "L" and "H" levels, respectively, an inverted signal of an output signal of multiplexer 22 is provided as a latch output D0.

Because of the above operation, the first to fourth sense amplifier portions select one data signal among data signals applied from four bit line pairs and amplify the selected data signal for output.

Referring again to FIG. 2, multiplexer 5 includes NMOS transistors Q1 to Q5, PMOS transistors Q6 to Q10, and inverters G1 to G6.

Multiplexer control signals SM0 to SM4 are applied to multiplexer 5 from redundancy control burst counter 6. In response to multiplexer control signals SM0 to SM4, multiplexer 5 selects predetermined data among data provided from first to fourth sense amplifier portions 2a to 2d and sense amplifier 3 for output. When multiplexer control signal SM0 is at the "H" level, and multiplexer control signals SM1 to SM4 are at the "L" level, for example, PMOS transistor Q1 and NMOS transistor Q6 are turned on, and output data D0 of first sense amplifier portion 2a is provided through inverter G6.

A control signal generating circuit included in redundancy control burst control 6 shown in FIG. 2 will now be described in detail with reference to FIG. 4.

Figure 4:
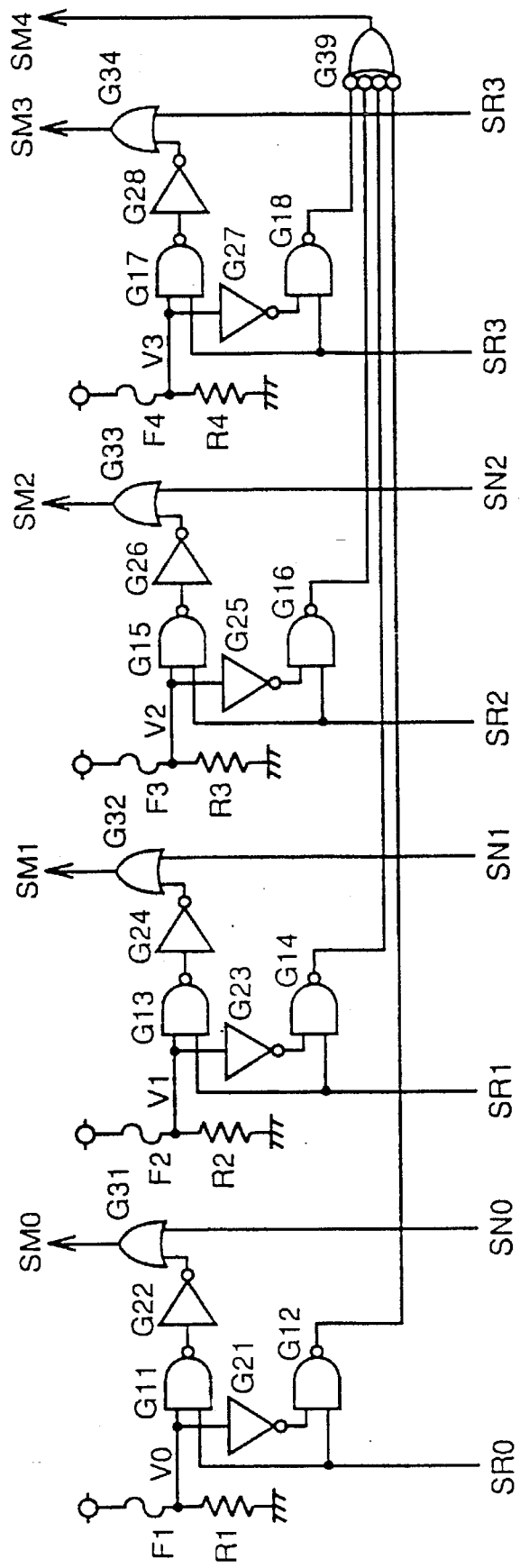
FIG. 4 is a circuit diagram showing a configuration of a control signal generating circuit of a redundancy control burst counter shown in FIG. 2.

In FIG. 4, the control signal generating circuit includes fuse elements F1 to F4, resistances R1 to R4, NAND gates G11 to G18, inverters G21 to G28, OR gates G31 to G34, and a gate G39.

The control signal generating circuit shown in FIG. 4 corresponds to 16 columns of ordinary memory cells and one column of redundancy memory cells. Four data are read out from the ordinary memory cells, and one of the data is read out from the redundancy memory cell. When the four data are all read out from non-defective memory cells, multiplexer control signals SM0 to SM4 are generated in response to four control signals SN0 to SN3, controlling operation of multiplexer 5 shown in FIG. 2. At this time, control signals SR0 to SR3 are all at the "L" level, and only one of control signals SN0 to SN3 is at the "H" level.

When the four data read out from the ordinary memory cells include data read out from a defective memory cell, the position of the data read out from the defective memory cell is programmed by disconnecting one fuse element among fuse elements F1 to F4. At this time, control signals SN0 to SN3 are all at the "L" level, and only one of control signals SR0 to SR3 attains the "H" level. As a result, multiplexer select signal SM4 is brought to a selected state instead of a multiplexer control signal corresponding to the defective data among four multiplexer control signals SM0 to SM4. Multiplexer 5 selects data of a redundancy memory cell provided from sense amplifier 3. The data of the redundancy memory cell is provided instead of data of the defective memory cell.

Figure 12:
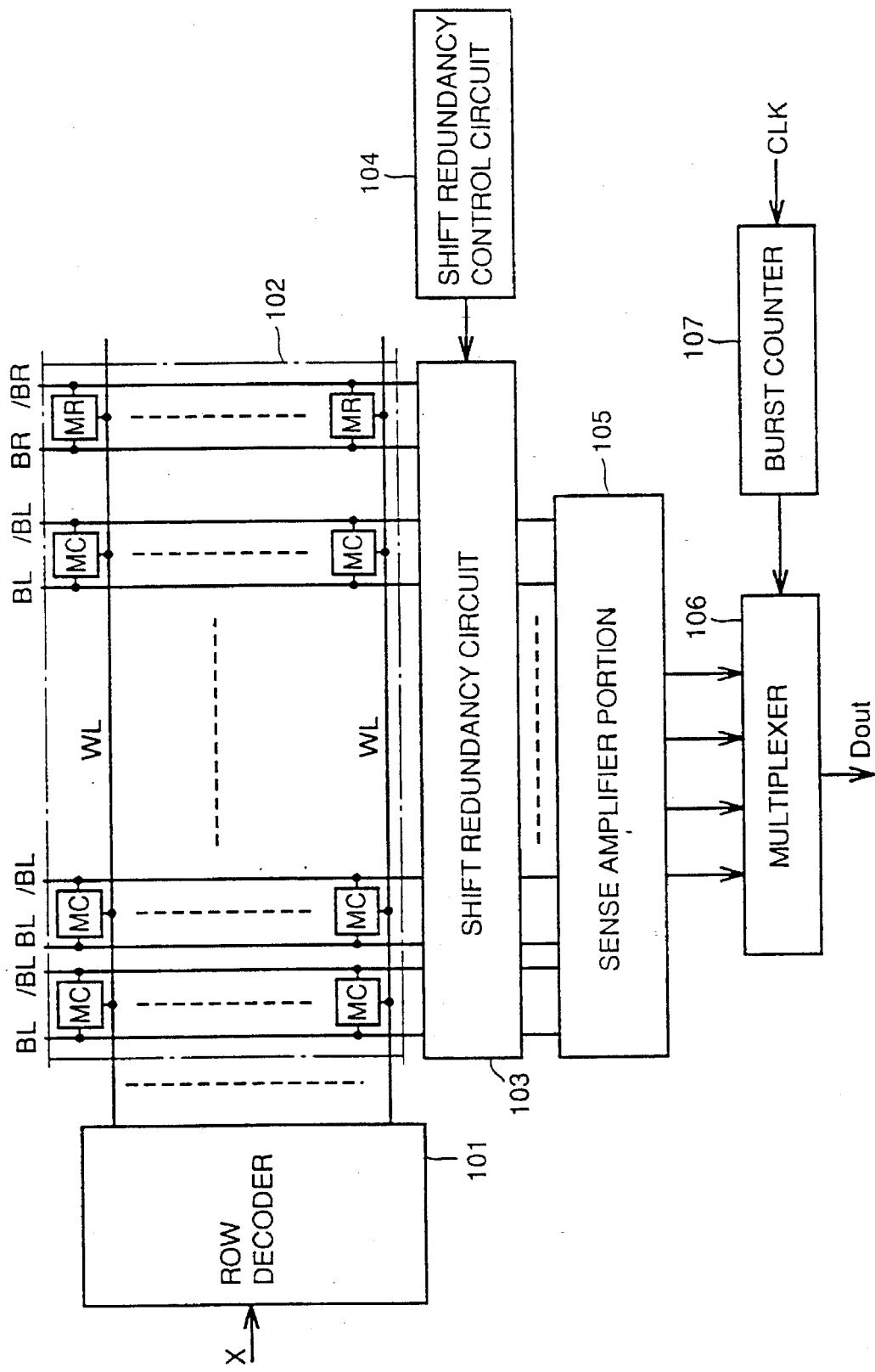
FIG. 12 is a block diagram showing a configuration of a conventional semiconductor memory device.
Figure 13:
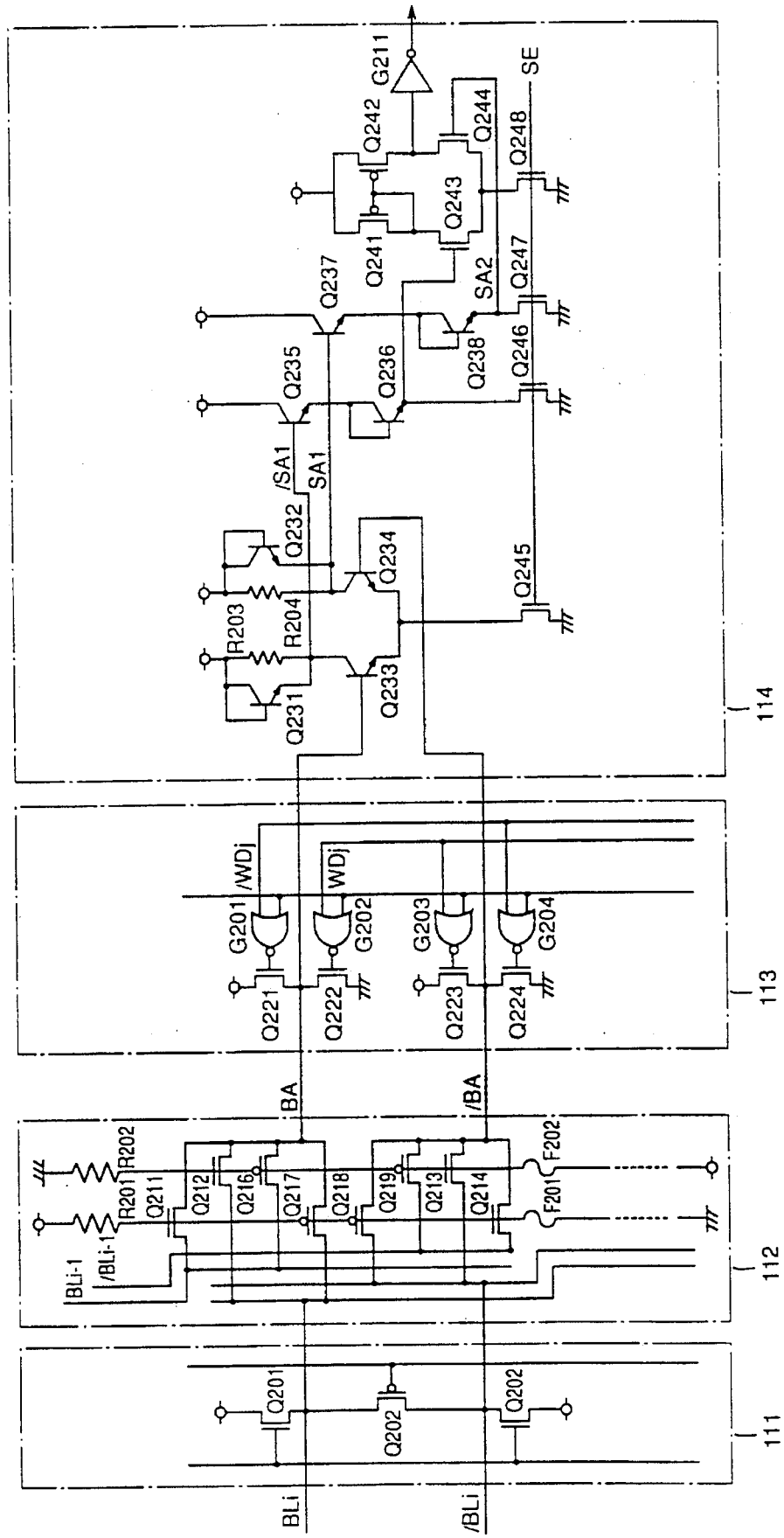
FIG. 13 is a circuit diagram showing a configuration of a shift redundancy circuit and sense amplifier portion shown in FIG. 12.

As described above, in the semiconductor memory device of this embodiment, a switching circuit, for example, a shift redundancy circuit shown in FIG. 12, is not connected in series in a path from input of address signal X to output of output data. Therefore, it is possible to suppress increase of an address access time caused by addition of a shift redundancy circuit.

It should be noted that the configuration of redundancy control burst counter 6 becomes complicated in this embodiment. As a result, generation of multiplexer control signals SM0 to SM4 might be delayed from clock signal CLK, causing change of output data from a clock input (clock access time) to be delayed. However, in practice, an address access time and a clock access time are set based on different specifications. Therefore, this embodiment can be used effectively in a device in which an address access time is set short, and in which a clock access time is set long.

Description will now be given of the semiconductor memory device according to the second embodiment of the present invention with reference to FIG. 5. Since row decoder 1, memory cell array 4 and sense amplifier 3 shown in FIG. 5 are similar to those shown in FIG. 1, the description thereof will not be repeated.

Figure 5:
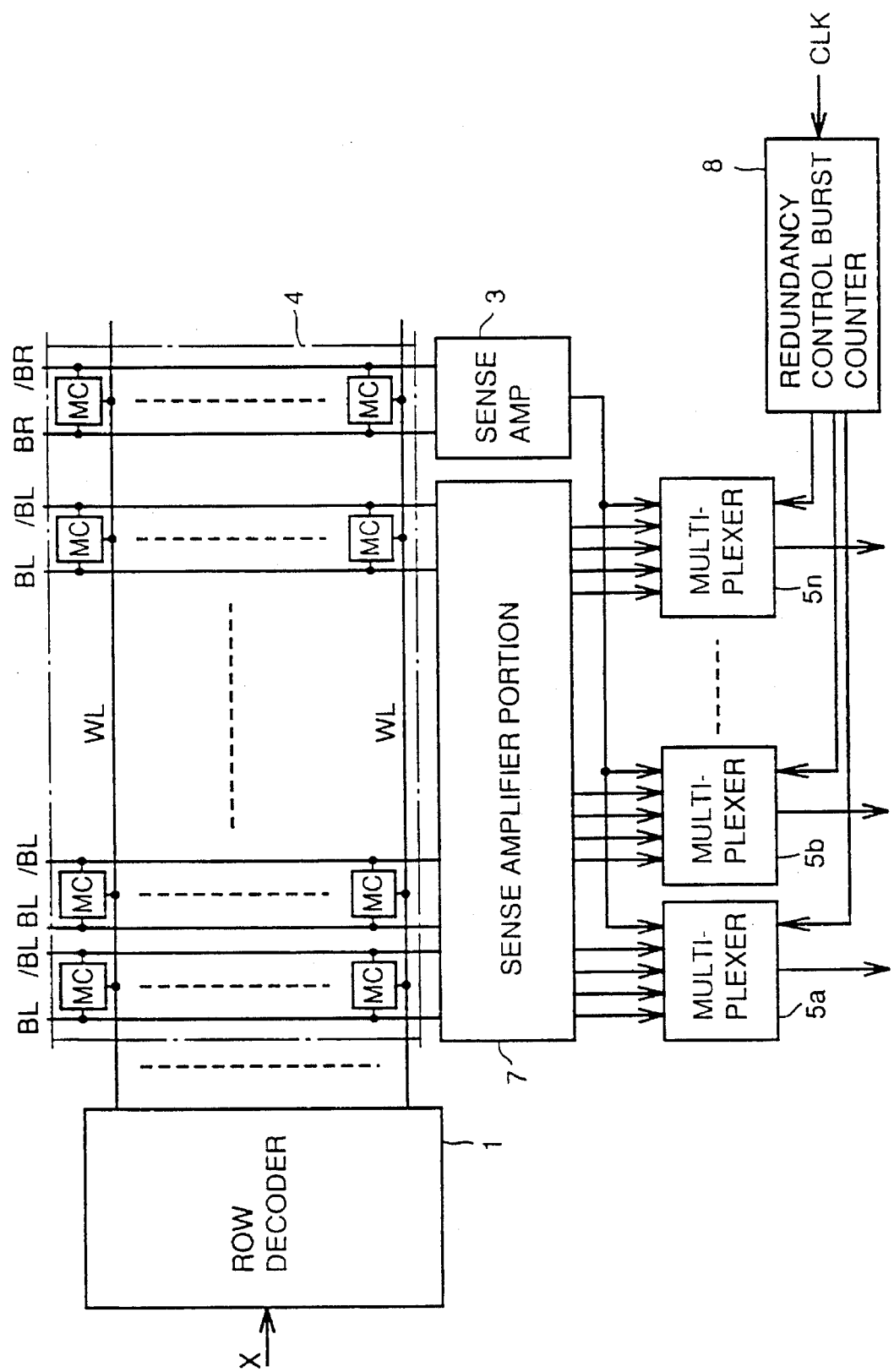
FIG. 5 is a block diagram showing a configuration of a semiconductor memory device according to a second embodiment of the present invention.

Referring to FIG. 5, a sense amplifier portion 7 amplifies data applied through bit lines BL, /BL, and provides directly the amplified data to a plurality of multiplexers 5a to 5n.

More specifically, sense amplifier portion 7 is configured as the first sense amplifier portion shown in FIG. 3 excluding multiplexer 22 and including a data latch for every sense amplifier.

Multiplexers 5a to 5n have the same configuration as that of multiplexer 5 shown in FIG. 2. Multiplexers 5a to 5n select predetermined data among data provided from sense amplifier portion 7 and sense amplifier 3 in response to multiplexer control signals provided from redundancy control burst counter 8 for output.

Redundancy control burst counter 8 includes a control signal generating circuit shown in FIG. 4 for every multiplexer in order to provide multiplexer control signals for controlling a plurality of multiplexers 5a to 5n. Therefore, in response to clock signal CLK, redundancy control burst counter 8 provides multiplexer control signals for controlling operation of a plurality of multipliers 5a to 5n.

Because of the above operation, it is possible to retrieve predetermined data from a plurality of multiplexers 5a to 5n, and to suppress increase of an address access time, similar to the case of the above-described first embodiment.

Description will now be given of the semiconductor memory device according to the third embodiment of the present invention with reference to FIG. 6.

Figure 6:
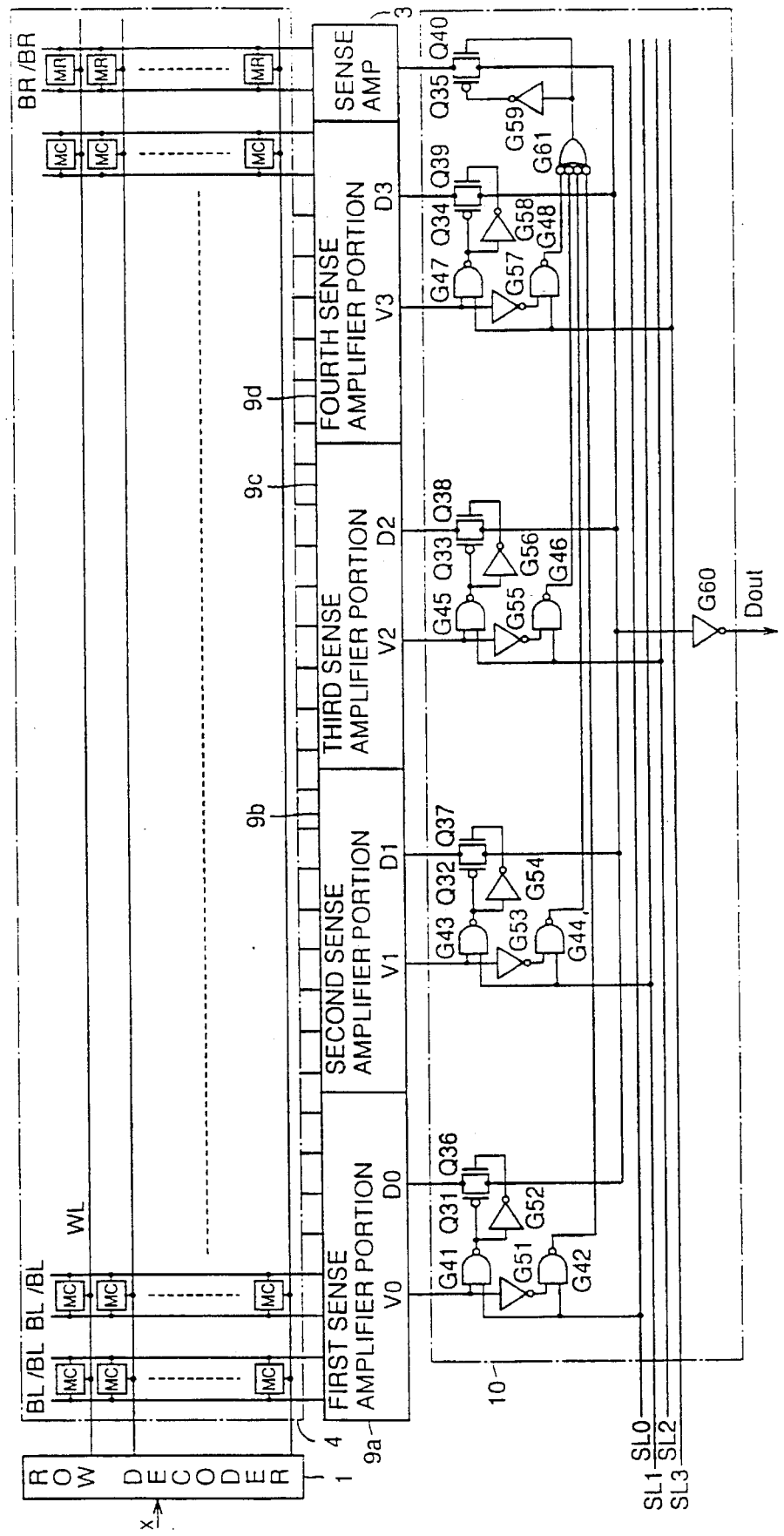
FIG. 6 is a block diagram showing a configuration of a semiconductor memory device according to a third embodiment of the present invention.

Since row decoder 1, memory cell array 4, and sense amplifier 3 shown in FIG. 6 are similar to those shown in FIG. 1, the description thereof will not be repeated.

In FIG. 6, the semiconductor memory device includes row decoder 1, sense amplifier 3, memory cell array 4, first to fourth sense amplifier portions 9a to 9d, and a multiplexer 10.

First to fourth sense amplifier portions 9a to 9d have the same configuration. Four data are applied to each of sense amplifier portions 9a to 9d from four bit line pairs BL, /BL. Each of sense amplifier portions 9a to 9d selects one among the four data and provides one of data signals D0 to D3. In addition, each of sense amplifier portions 9a to 9d provides one of valid signals V0 to V3 serving as a defective information signal indicating whether or not the data signal corresponds to a defective portion in the memory cell array.

Figure 7:
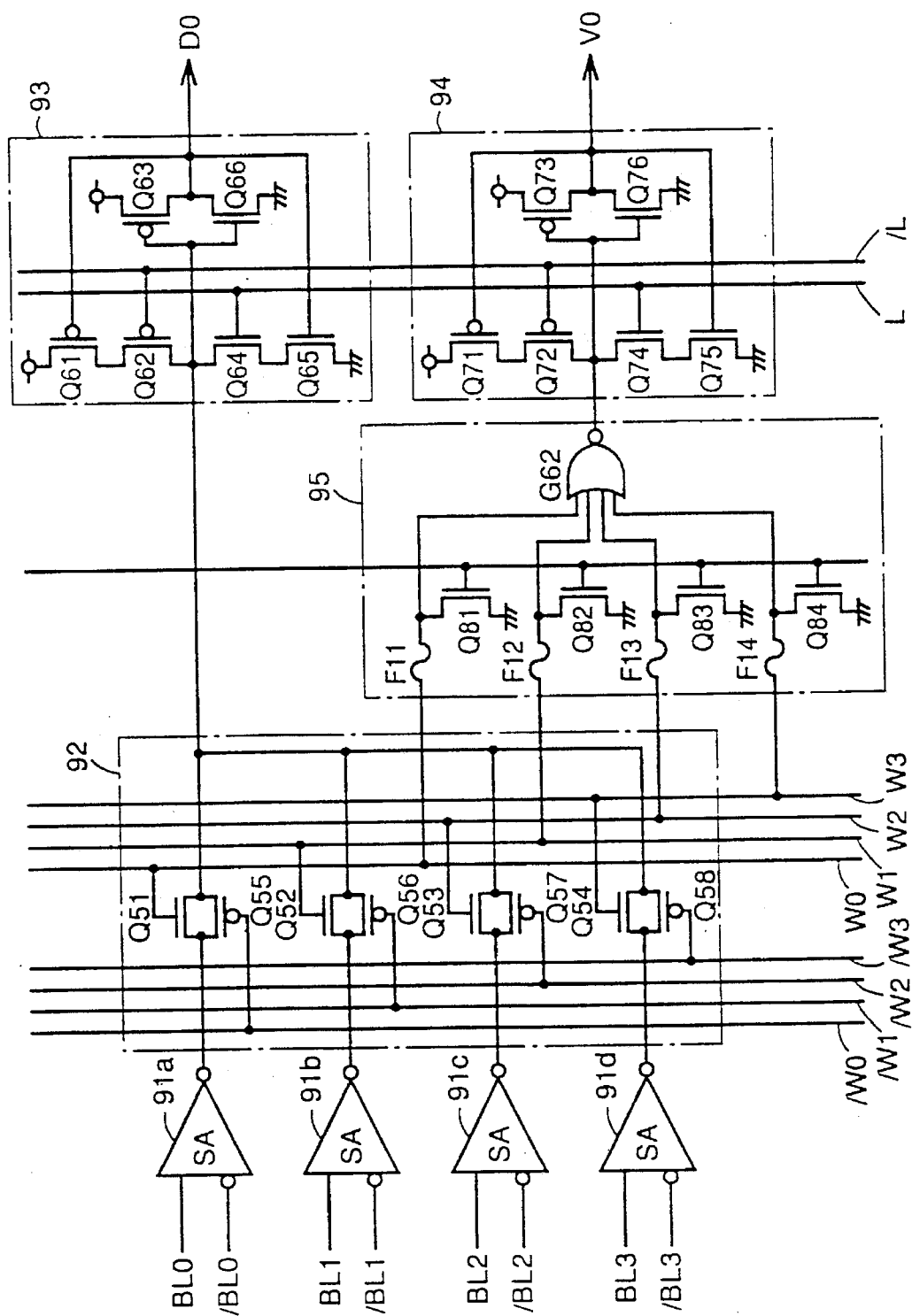
FIG. 7 is a circuit diagram showing a configuration of a first sense amplifier portion shown in FIG. 6.

The first to fourth sense amplifier portions will now be described in more detail. FIG. 7 is a circuit diagram showing a configuration of the first sense amplifier portion shown in FIG. 6.

In FIG. 7, the first sense amplifier portion includes sense amplifiers 91a to 91d, a multiplexer 92, a data latch 93, a valid latch 94, and a program portion 95.

Multiplexer 92 includes NMOS transistors Q51 to Q54 and PMOS transistors Q55 to Q58. Data latch 93 includes PMOS transistors Q61 to Q63 and NMOS transistors Q64 to Q66. Valid latch 94 includes PMOS transistors Q71 to Q73 and NMOS transistors Q74 to Q76. Program portion 95 includes fuse elements F11 to F14, NMOS transistors Q81 to Q84, and an NOR gate G62.

Since sense amplifiers 91a to 91d, multiplexer 92, and data latch 93 have the similar configuration as those shown in FIG. 3, and operate similarly, the description thereof will not be repeated.

Description will now be given of program portion 95. Fuse elements F11 to F14 are for programming the position of a column including a defect. Fuse element F11 corresponds to sense amplifier 91a, and the other fuse elements correspond to the other sense amplifiers, similarly. When data of a column including a defect is selected in response to select signals W0 to W3, /W0 to /W3, and data of a column including a defect is transferred to data latch 93, a corresponding fuse element among fuse elements F11 to F14 is disconnected. Therefore, an output signal of valid latch 94 attains the "L" level, indicating an invalid state. On the contrary, when data of a column not including a defect is transferred, a corresponding fuse element among fuse elements F11 to F14 is not disconnected. Therefore, an output signal of valid latch 94 attains the "H" level, indicating a valid state. Therefore, valid signal V0 provided from valid latch 94 can indicate whether output data D0 provided from data latch 93 is valid or invalid.

Referring again to FIG. 6, multiplexer 10 will be described. Multiplexer 10 includes NAND gates G41 to G48, inverters G51 to G60, PMOS transistors Q31 to Q35, NMOS transistors Q36 to Q40, and a gate G61.

Four control signals SL0 to SL3 are applied to multiplexer 10. When valid signals V0 to V3 are at the "H" level, that is, when data provided from first to fourth sense amplifier portions 9a to 9d are not defective, data provided from a predetermined sense amplifier portion is selected, in response to control signals SL0 to SL3, and provided through inverter G60. When control signal SL0 is at the "H" level, and control signals SL1 to SL3 are at the "L" level, for example, only transistors Q31 and Q36 are turned on, and output data D0 is provided.

On the other hand, when a defect occurs, and one of valid signals V0 to V3 attains the "L" level, only transistors Q35 and Q40 are turned on, and data of redundancy memory cell MR is provided through sense amplifier 3.

Because of the above operation, in response to valid signals V0 to V3 and control signals SL0 to SL3, multiplexer 10 can provide, when a defect does not occur, data selected in response to control signals SL0 to SL3, and can provide, when a defect occurs, data of redundancy memory cell MR instead of data of a memory cell including the defect, thereby remedying a memory cell including the defect.

As described above, in this embodiment, it is possible to reduce the number of control signals from eight to four as compared to the control signal generating circuit shown in FIG. 4. Therefore, generation of control signals can be simplified, thereby reducing an area for an interconnection region and a circuit region. As a result, high integration of the device can be implemented, making it possible to implement the same function with a small chip size.

Figure 8:
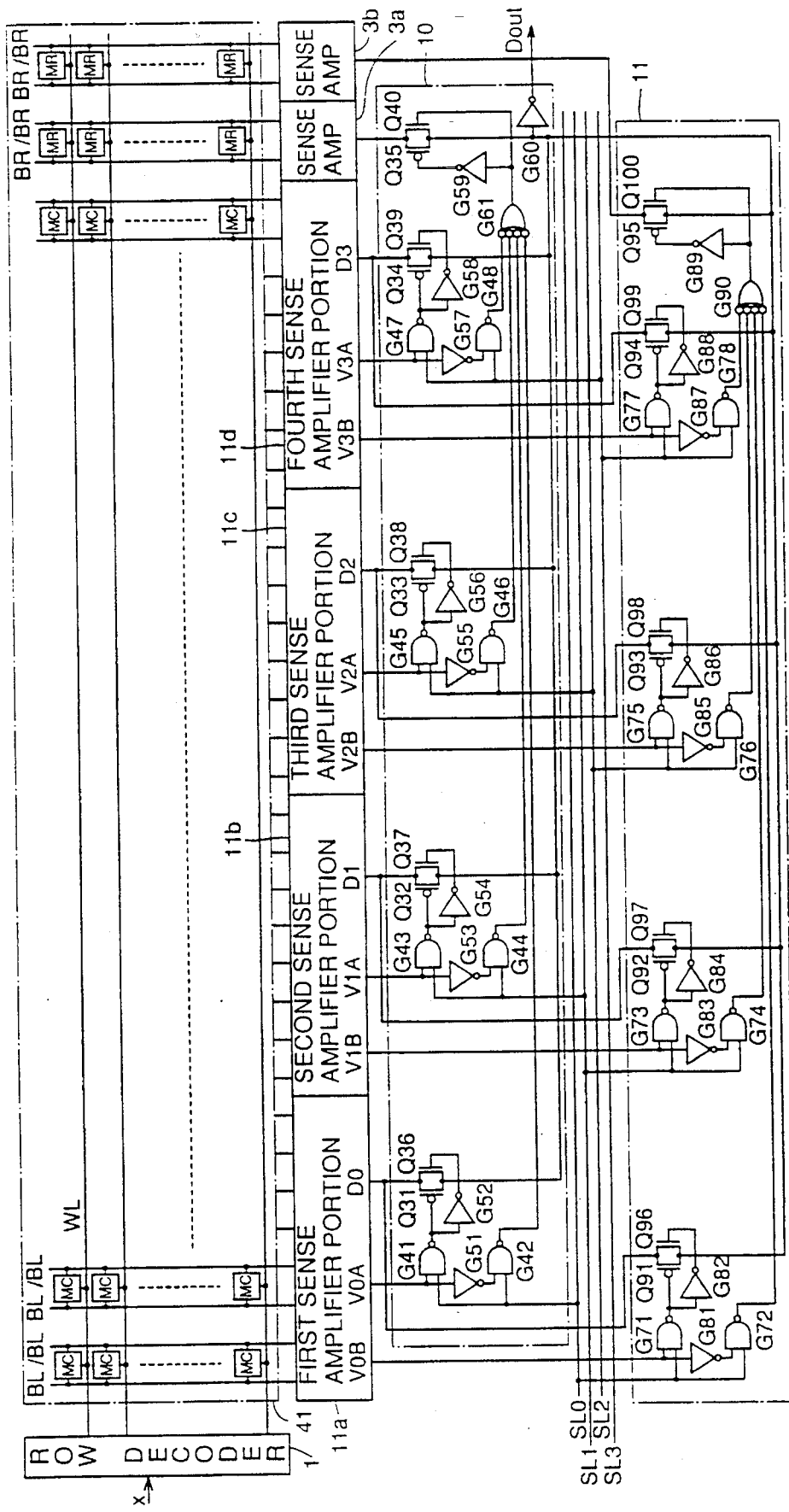
FIG. 8 is a block diagram showing a configuration of a semiconductor memory device according to a fourth embodiment of the present invention.

The fourth embodiment of the present invention will now be described. Compared to the above third embodiment in which a defect in one column is remedied, the semiconductor memory device according to the fourth embodiment can remedy defects in two columns. FIG. 8 is a block diagram showing a configuration of the semiconductor memory device according to the fourth embodiment of the present invention.

In FIG. 8, the semiconductor memory device includes row decoder 1, a memory cell array 41, first to fourth sense amplifier portions 11a to 11d, sense amplifiers 3a, 3b, and multiplexers 10, 11.

Memory cell array 41 and memory cell array 4 shown in FIG. 6 are different in that memory cell array 41 includes two pairs of redundancy bit lines BR, /BR and two columns of redundancy memory cells MR. Therefore, in memory cell array 4, defects in two columns can be remedied.

To first sense amplifier portion 11a, connected are four pairs of bit lines BL, /BL, through which four data are applied. First sense amplifier portion 11a selects one among four applied data, and provides two independent valid signals V0A, V0B. Second to fourth sense amplifier portions 11b to 11d have the same configuration as that of first sense amplifier portion 11a.

Figure 9:
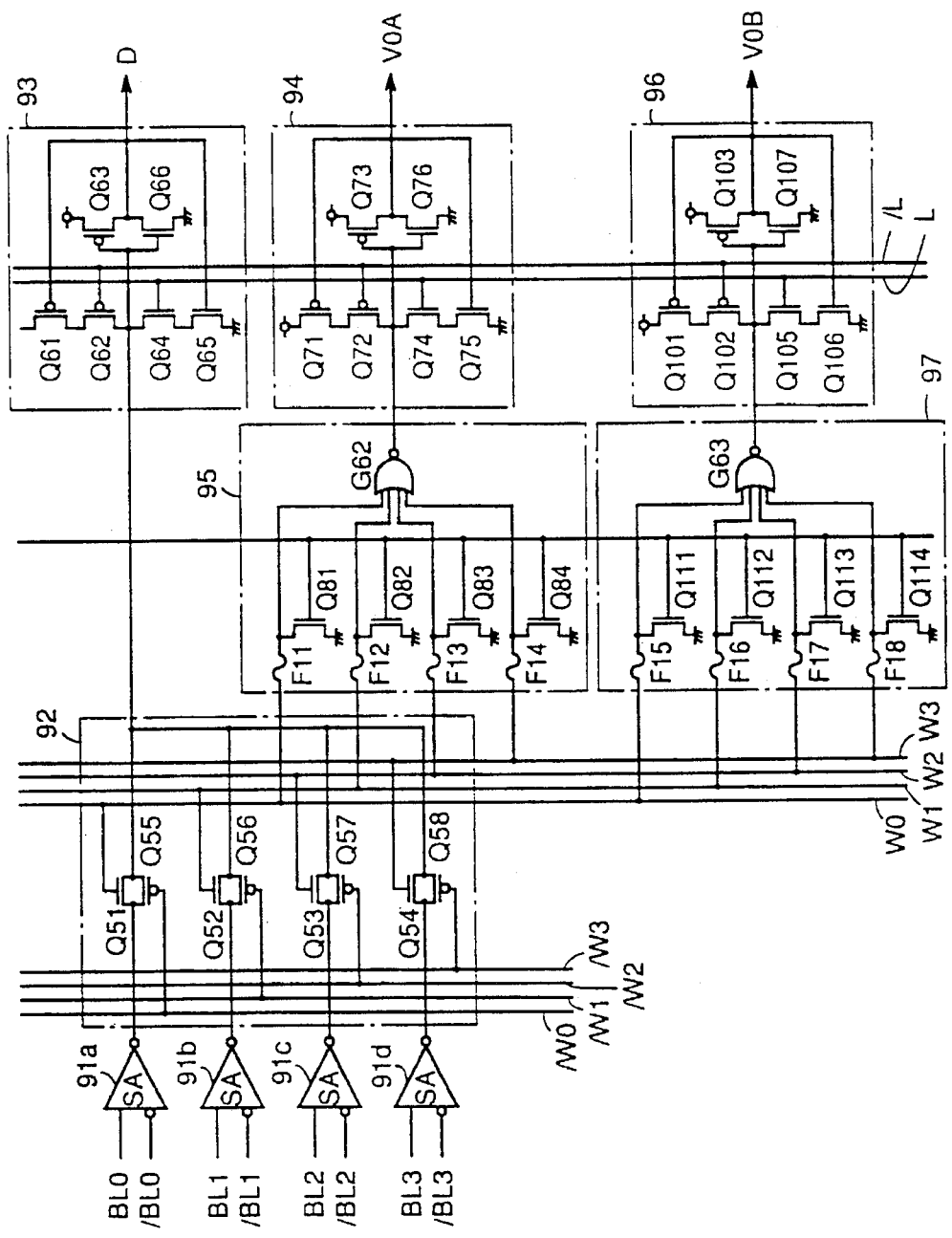
FIG. 9 is a circuit diagram showing a configuration of a first sense amplifier portion shown in FIG. 8.

First sense amplifier portion 11a will now be described in detail. FIG. 9 is a circuit diagram showing a configuration of the first sense amplifier portion shown in FIG. 8.

In FIG. 9, the first sense amplifier portion includes sense amplifiers 91a to 91d, multiplexer 92, data latch 93, first valid latch 94, first program portion 95, a second valid latch 96, and a second program portion 97. Since sense amplifiers 91a to 91d, multiplexer 92, data latch 93, first valid latch 94, and first program portion 95 shown in FIG. 9 are similar to those shown in FIG. 7, the same reference characters are given and the description thereof will not be repeated.

Second valid latch 96 includes PMOS transistors Q101 to Q103 and NMOS transistors Q105 to Q107. Second program portion 97 includes fuse elements F15 to F18, NMOS transistors Q111 to Q114, and an NOR gate G63. Second valid latch 96 and second program portion 97 have the same configurations as those of first valid latch 94 and first program portion 95, and operate similarly. Therefore, in response to select signals W0 to W3, second valid latch 96 and second program portion 97 provide two valid signals V0A, V0B.

Referring again to FIG. 8, multiplexer 10 has the same configuration as that of multiplexer 10 shown in FIG. 6. Similar to the case of the third embodiment, in response to valid signals V0A to V3A and control signals SL0 to SL3, multiplexer 10 provides data applied through sense amplifier 3a when there is a defect, and provides data D0 to D3 applied from first to fourth sense amplifier portions 11a to 11d as output data Dout when there is no defect.

Multiplexer 11 includes NAND gates G71 to G78, inverters G81 to G89, PMOS transistors Q91 to Q95, NMOS transistors Q96 to Q100, and a gate G90. Multiplexer 11 has a configuration approximately the same as that of multiplexer 10, and operates similarly. More specifically, in response to valid signals V0B to V3B provided from first to fourth sense amplifier portions 11a to 11d and control signals SL0 to SL3, multiplexer 11 provides data D0 to D3 provided from first to fourth sense amplifier portions 11a to 11d when there is no defect, and provides data from redundancy memory cell MR applied through sense amplifier 3b to inverter G60 when there is a defect.

Because of the above operation, the semiconductor memory device according to the fourth embodiment can remedy defects in two columns. Therefore, similar to the above, by adding a plurality of columns of redundancy memory cells or the like, defects in a plurality of columns can be remedied.

Figure 10:
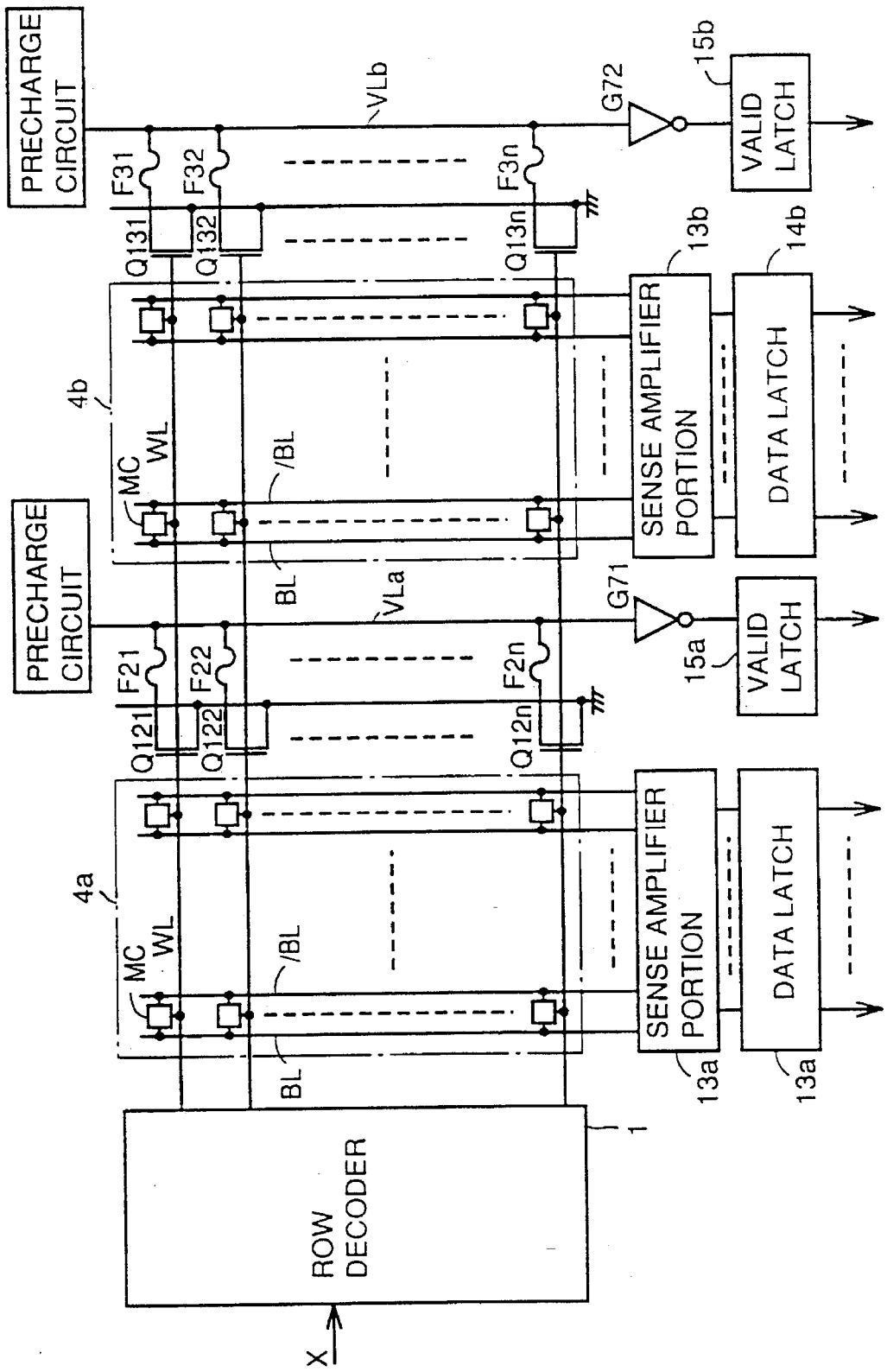
FIG. 10 is a block diagram showing a configuration of a semiconductor memory device according to a fifth embodiment of the present invention.

Description will now be given of the semiconductor memory device according to the fifth embodiment of the present invention. In the above-described third embodiment, since an ordinary memory cell was replaced with a redundancy memory cell for each column, one valid latch was required for one data latch. In this embodiment, by providing a valid signal corresponding to each row, the number of valid latches with respect to all the data latches can be reduced. FIG. 10 is a block diagram showing a configuration of the semiconductor memory device according to the fifth embodiment of the present invention.

In FIG. 10, the semiconductor memory device includes row decoder 1, memory cell arrays 4a, 4b, precharge circuits 12a, 12b, sense amplifier portions 13a, 13b, data latches 14a, 14b, valid latches 15a, 15b, NMOS transistors Q121 to Q12n, Q131 to Q13n, fuse elements F21 to F2n, F31 to F3n, and inverters G71, G72.

When one word line WL is selected in response to address signal X, a corresponding NMOS transistor among corresponding NMOS transistors Q121 to Q12n is turned on. When there is a defect in a row, a corresponding one of fuse elements F21 to F2n is disconnected. A signal line VLa is precharged to a predetermined potential by precharge circuit 12a. Therefore, when a row not including a defect is selected, corresponding valid latch 15a provides a signal at the "H" level (valid), since fuse elements are not disconnected. On the contrary, when a row including a defect is selected, corresponding valid latch 15a provides a signal at the "L" level (invalid). As a result, in response to a valid signal provided from valid latch 15a, by using data provided from a redundancy memory cell array (not shown) provided separately, a defective portion can be replaced similar to the case of the third embodiment. Precharge circuit 12b, valid latch 15b and the like operate similar to the above.

Because of the above operation, the semiconductor memory device of this embodiment can further reduce the number of valid latches for all the data latches, enabling further reduction of an area for a circuit portion and high integration.

Description will now be given of the semiconductor memory device according to the sixth embodiment of the present invention. The semiconductor memory device according to this embodiment is a combination of the above-described methods for remedying a column defect and a row defect. The semiconductor memory device of this embodiment can remedy random defects on a memory cell array.

Figure 11:
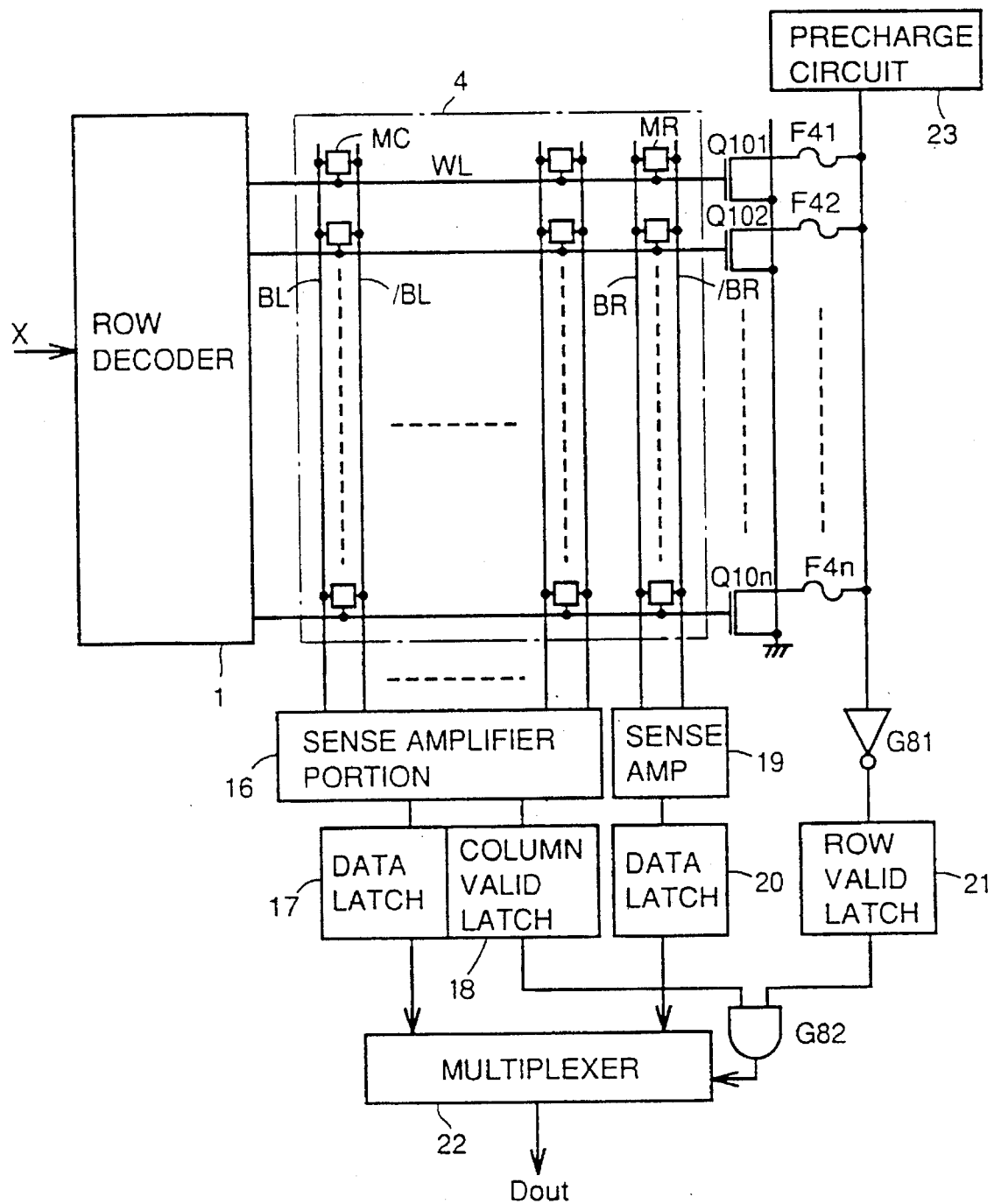
FIG. 11 is a block diagram showing a configuration of a semiconductor memory device according to a sixth embodiment of the present invention.

FIG. 11 is a diagram showing a configuration of the semiconductor memory device according to the sixth embodiment of the present invention.

In FIG. 11, the semiconductor memory device includes row decoder 1, memory cell array 4, sense amplifier portion 16, a sense amplifier 19, a data latch 17, a column valid latch 18, a sense amplifier 19, a data latch 20, a row valid latch 21, a multiplexer 22, a precharge circuit 23, NMOS transistors Q141 to Q14n, fuse elements F41 to F4n, an inverter G81 and an AND gate G82.

Description will first be given of the column system. Sense amplifier portion 16 includes circuits similar to sense amplifiers 91a to 91d, multiplexer 92, and program portion 95 shown in FIG. 7. Sense amplifier portion 16 amplifies data applied from a plurality of bit line pairs Bl, /BL by sense amplifiers, and provides predetermined data to data latch 17 in response to control signals W0 to W3, /W0 to /W3. Sense amplifier portion 16 provides a valid signal set by the program portion to column valid latch 18. Data latch 17 and column valid latch 18 latch applied data and an applied valid signal, respectively. Data latch 17 provides the latched data to multiplexer 22 and column valid latch 18 provides the latched column valid signal to AND gate G82.

Description will now be given of the row system. Precharge circuit 23, NMOS transistors Q141 to Q14n, fuse elements F41 to F4n, inverter G71, row valid latch 21 have the same configuration as those of precharge circuit 12a, NMOS transistors Q121 to Q12n, fuse elements F21 to F2n, inverter G71, and valid latch 15a shown in FIG. 10, and operate similarly. Therefore, when a row not including a defect is selected, valid latch 21 provides a row valid signal at the "H" level (valid). When a row including a defect is selected, valid latch 21 provides a row valid signal at the "L" level (invalid) and transmits the same to AND gate G82.

Therefore, it is possible to provide a column valid signal indicating whether data from a selected column is valid or invalid, to provide a row valid signal indicating whether data from a selected row is valid or invalid, and to indicate whether the data is defective or non-defective by a valid signal obtained by ANDing the row valid signal and the column valid signal.

To multiplexer 22, applied are data of an ordinary memory cell array from data latch 17, data of a redundancy memory cell array from data latch 20, and a valid signal indicating whether data from AND gate G82 is defective or non-defective. Therefore, in response to the applied valid signal, multiplexer 22 selects predetermined data among data provided from data latch 17 for output when there is no defect, and provides data provided from data latch 20 when there is a defect, making it possible to remedy random defects on a memory cell array.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a memory cell array including a plurality of memory cells arranged in a matrix manner;

a redundancy memory cell array including a redundancy memory cell used when a defect occurs in said memory cell;

first reading means comprising a plurality of reading means for reading out data from said memory cell array;

second reading means for reading out data from said redundancy memory cell array; and selecting means for selecting predetermined data among a plurality of data provided from said plurality of reading means of said first reading means and data provided from said second reading means, for replacing data provided from said first reading means with data provided from said second reading means when a defect occurs in said memory cell, and for selecting predetermined data among said data for sequential output, wherein said first reading means includes
a plurality of sense amplifier portions providing data of a predetermined memory cell among a plurality of memory cells in said memory cell array, and said selecting means includes
a redundancy control burst counter providing a multiplexer control signal for selecting a predetermined output among outputs of said plurality of sense amplifier portions and said second reading means, and
a multiplexer selecting a predetermined output among outputs of said plurality of sense amplifier portions and said second reading means for output in response to said multiplexer control signal.

2. The semiconductor memory device as recited in claim 1, wherein said sense amplifier portions each include
a plurality of sense amplifiers amplifying data of a corresponding memory cell in said memory cell array,
a reading multiplexer selecting an output of a predetermined sense amplifier among outputs of said plurality of sense amplifiers in response to a select signal, and
a data latch latching an output of said reading multiplexer.

3. The semiconductor memory device as recited in claim 1, wherein said redundancy control burst counter provides
a multiplexer control signal for, when the outputs of said plurality of sense amplifier portions are data of a non-defective memory cell, selecting a predetermined output among the outputs of said plurality of sense amplifier portions in response to a control signal, and
a multiplexer control signal for, when at least one of the outputs of said plurality of sense amplifier portions is data of a defective memory cell, programming a position of the defective memory cell to select the output of said second reading means in place of data of the defective memory cell in response to the program result and said control signal.

4. The semiconductor memory device as recited in claim 3, wherein said redundancy control burst counter includes
a plurality of fuse elements provided corresponding to said plurality of sense amplifier portions for programming the position of the defective memory cell.

5. The semiconductor memory device as recited in claim 4, wherein said redundancy memory cell array includes a redundancy column including a plurality of memory cells arranged in one column in the column direction, said selecting means replaces data of one column including a defective memory cell in said memory cell array with data of said redundancy column.

6. A semiconductor memory device, comprising:

a memory cell array including a plurality of memory cells arranged in a matrix manner;

a redundancy memory cell array including a redundancy memory cell used when a defect occurs in said memory cell;

first reading means comprising a plurality of reading means for reading out data from said memory cell array;

second reading means for reading out data from said redundancy memory cell array; and selecting means for selecting predetermined data among a plurality of data provided from said plurality of reading means of said first reading means and data provided from said second reading means, for replacing data provided from said first reading means with data provided from said second reading means when a defect occurs in said memory cell, and for selecting predetermined data among said data for sequential output, wherein said first reading means includes
a sense amplifier portion amplifying data of said memory cell for every one column of said memory cell array for output, said selecting means includes
a plurality of multiplexers selecting a predetermined output among corresponding ones of outputs of said sense amplifier portion and the output of said second reading means for output, and
a redundancy control burst counter providing said multiplexer control signal for each of said plurality of multiplexers,
said plurality of multiplexers each select a predetermined output among corresponding ones of the outputs of said sense amplifier portion and the output of said second reading means for output in response to said multiplexer control signal.

7. A semiconductor memory device, comprising:

a memory cell array including a plurality of memory cells arranged in a matrix manner;

a redundancy memory cell array including a redundancy memory cell used when a defect occurs in said memory cells;

first reading means comprising a plurality of reading means for reading out data from said memory cell array;

second reading means for reading out data from said redundancy memory cell array;

defect information signal output means for providing a defect information signal indicating whether or not data provided from said first reading means is data corresponding to a defective memory cell in said memory cell array; and selecting means for selecting predetermined data among a plurality of data provided from said plurality of reading means of said first reading means and data provided from said second reading means for, when a defect occurs in said memory cell, replacing data provided from said first reading means with data provided from said second reading means in response to said defect information signal, and for selecting predetermined data between said data for sequential output.

8. The semiconductor memory device as recited in claim 7, wherein said first reading means includes
a plurality of sense amplifiers amplifying data of a corresponding memory cell in said memory cell array,
a reading multiplexer selecting an output of a predetermined sense amplifier among outputs of said plurality of sense amplifiers in response to a select signal, and
a data latch latching an output of said reading multiplexer, said defect information signal output means includes
programming means for programming a position of a defective memory cell in said memory cell array to provide a signal in response to the program result and said select signal, and
a valid latch latching a signal provided from said programming means for providing said defect information signal in response to the signal provided from said programming means.

9. The semiconductor memory device as recited in claim 8, wherein said programming means includes
a plurality of fuse elements provided for each of said plurality of sense amplifiers.

10. The semiconductor memory device as recited in claim 9, wherein said redundancy memory cell array includes
a redundancy column including a plurality of redundancy memory cells arranged in one column in the column direction, and
said selecting means replaces data of one column of said memory cell array with data of said redundancy column.

11. The semiconductor memory device as recited in claim 7, wherein said redundancy memory cell array includes
two redundancy columns each including a plurality of redundancy memory cells arranged in one column in the column direction,
said defect information signal output means provides two independent said defect information signals,
said selecting means includes
first selecting means receiving data provided from said first and second reading means for, when a defect occurs in said memory cell, replacing data provided from said first reading means with data provided from one of said redundancy columns in response to one of said defect information signals, and for selecting predetermined data between said data for sequential output, and
second selecting means receiving data provided from said first and second reading means for, when a defect occurs in said memory cell, replacing data provided from said first reading means with data provided from the other of said redundancy columns in response to the other of said defect information signals, and for selecting predetermined data between said data for sequential output.

12. The semiconductor memory device as recited in claim 11, wherein said first reading means includes
a plurality of sense amplifiers amplifying data of a corresponding memory cell in said memory cell array,
a reading multiplexer selecting an output of a predetermined sense amplifier among outputs of said plurality of sense amplifiers in response to a select signal, and
a data latch latching an output of said reading multiplexer, and said defect information output means includes
first and second programming means for programming a position of a defective memory cell to provide a signal in response to the program result and said select signal, and
first and second valid latches provided corresponding to said first and second programming means for latching signals provided from first and second programming means to provide said defect information signals in response to the signals provided from said first and second programming means.

13. The semiconductor memory device as recited in claim 12, wherein said first and second programming means each include
a plurality of fuse elements provided for said plurality of sense amplifiers.

14. The semiconductor memory device as recited in claim 7, wherein said defect information signal output means includes
row defect signal output means for providing said detect information signal corresponding to the row direction of said memory cell array.

15. The semiconductor memory device as recited in claim 14, wherein said defect information signal output means includes
programming means for programming a position of a defective memory cell in the row direction of said memory cell array, and a valid latch latching an output of said programming means to provide said defect information signal.

16. The semiconductor memory device as recited in claim 15, wherein said programming means includes
a plurality of fuse elements provided corresponding to each row of said memory cell array.

17. The semiconductor memory device as recited in claim 7, wherein said defect information signal output means includes
row defect information signal output means for providing a row defect information signal indicating whether or not a defective memory cell exists in the row direction of said memory cell array, and
column defect information signal output means for providing a column defect information signal indicating whether or not a defective memory cell exists in the column direction of said memory cell array, said selecting means replaces data provided from said first reading means with data provided from said second reading means when a defect occurs in said memory cell in response to a logical product of said row defect information signal and said column defect information signal, and selects predetermined data between said data for sequential output.

\* \* \* \* \*